US010748891B1

(12) United States Patent
Dutta

(10) Patent No.: US 10,748,891 B1
(45) Date of Patent: Aug. 18, 2020

(54) ELECTROSTATIC DISCHARGE (ESD) ROBUST TRANSISTOR

(71) Applicant: QUALCOMM Incorporated, San Diego, CA (US)

(72) Inventor: Ranadeep Dutta, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/274,129

(22) Filed: Feb. 12, 2019

(51) Int. Cl.
*H01L 27/02* (2006.01)
*H01L 29/78* (2006.01)
*H01L 29/66* (2006.01)
*H01L 29/06* (2006.01)

(52) U.S. Cl.
CPC ...... *H01L 27/0266* (2013.01); *H01L 29/0696* (2013.01); *H01L 29/66484* (2013.01); *H01L 29/66492* (2013.01); *H01L 29/7831* (2013.01); *H01L 29/7835* (2013.01)

(58) Field of Classification Search
CPC ............. H01L 27/0266; H01L 29/0696; H01L 29/66484; H01L 29/66492; H01L 29/7831; H01L 29/7835
See application file for complete search history.

(56) References Cited

U.S. PATENT DOCUMENTS 5,616,945 A * 4/1997 Williams ............ H01L 27/0629 257/296
6,140,682 A * 10/2000 Liu ..................... H01L 27/0266 257/355
6,476,449 B1 * 11/2002 Lin ................... H01L 21/28518 257/360
10,535,752 B2 * 1/2020 Thei .................. H01L 29/42364
2004/0056312 A1 * 3/2004 Asada ............. H01L 21/823418 257/368
2005/0029597 A1 * 2/2005 Worley ............... H01L 29/0692 257/355
2014/0183655 A1 * 7/2014 Robinson ............ H01L 27/0623 257/370
2016/0268800 A1 * 9/2016 Kushner ............. H01L 27/0266
2019/0371906 A1 * 12/2019 Thei .................. H01L 29/41775
2020/0006550 A1 * 1/2020 Todd ................... H01L 29/0696
2020/0091310 A1 * 3/2020 Thei .................... H01L 29/7833

* cited by examiner

*Primary Examiner* — Allan R Wilson
(74) *Attorney, Agent, or Firm* — Seyfarth Shaw LLP

(57) ABSTRACT

A multi-gate active device includes a source region coupled to source contacts and a first drain region coupled to first drain contacts. The multi-gate active device also includes a first meshed silicide stop on the first drain region. The first meshed silicide stop surrounds the first drain contacts. The multi-gate active device further includes a first gate over a first channel between the source region and the first drain region.

11 Claims, 13 Drawing Sheets

ELECTROSTATIC DISCHARGE (ESD) ROBUST TRANSISTOR

TECHNICAL FIELD

The present disclosure generally relates to integrated circuits (ICs). More specifically, the present disclosure relates to a transistor with improved electrostatic discharge rating.

BACKGROUND

The design complexity of integrated circuits (e.g., mobile radio frequency (RF) chips or transceivers) is complicated by added circuit functions to support communication enhancements. The design of these mobile RF front ends may include the use of silicon-on-insulator technology. Silicon-on-insulator (SOI) technology replaces conventional bulk semiconductor (e.g., silicon) substrates (e.g., wafers) with a layered silicon-insulator-silicon substrate to improve performance.

The active devices on the SOI layer may include complementary metal oxide semiconductor (CMOS) transistors. RF switch devices of mobile RF front ends may be fabricated using CMOS transistors on SOI substrates.

SUMMARY

A multi-gate active device includes a source region coupled to source contacts and a first drain region coupled to first drain contacts. The multi-gate active device also includes a first meshed silicide stop on the first drain region. The first meshed silicide stop surrounds the first drain contacts. The multi-gate active device further includes a first gate over a first channel between the source region and the first drain region.

A method of making a multi-gate active device includes creating a source region coupled to source contacts and creating a first drain region coupled to first drain contacts. The method also includes depositing a first meshed silicide stop on the first drain region. The first meshed silicide stop surrounds the first drain contacts. The method further includes fabricating a first gate over a first channel between the source region and the first drain region.

A multi-gate active device includes a source region coupled to source contacts and a first drain region coupled to first drain contacts. The multi-gate active device also includes means for protecting the first drain region from silicidation. The protecting means surrounds the first drain region. The multi-gate active device further includes a first gate over a first channel between the source region and the first drain region.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
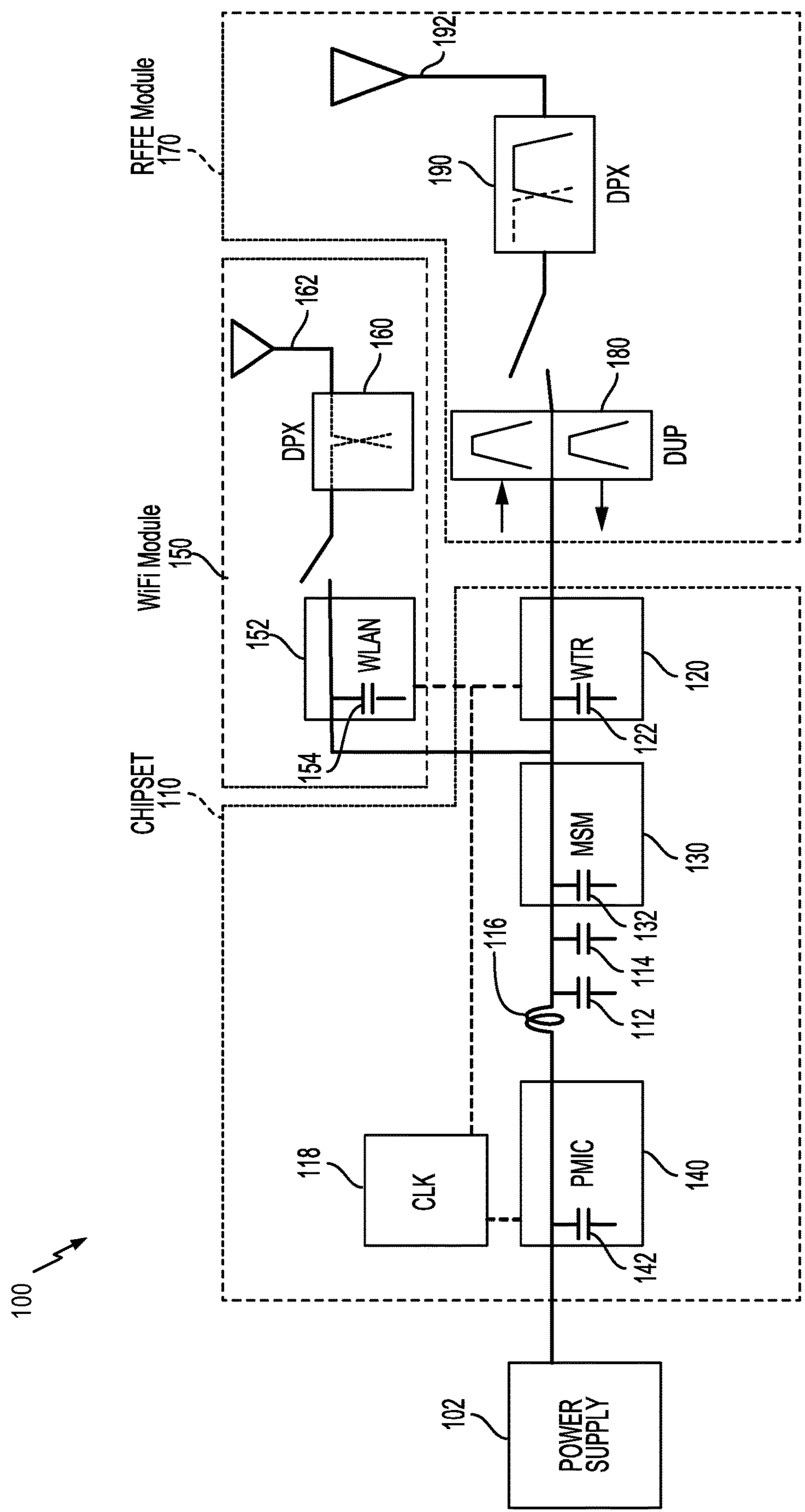
FIG. 1 is a schematic diagram of a radio frequency (RF) front-end module.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably.

Silicon-on-insulator (SOI) technology refers to the use of a layered silicon-insulator-silicon substrate in place of a conventional silicon substrate in semiconductor manufacturing, especially microelectronics, to improve performance. An integrated circuit built using SOI devices may show processing speed that is approximately thirty percent (30%) faster than a comparable bulk-based integrated circuit and power consumption is reduced by as much as eighty percent (80%), which makes it ideal for mobile devices. SOI chips also reduce soft error rate, which is data corruption caused by cosmic rays and natural radioactive background signals. SOI transistors offer a unique opportunity for CMOS architectures to be more scalable.

In some examples, a layer transfer process transfers a top active device portion of an SOI wafer to a handle wafer. In this process, the top portion of the SOI wafer is bonded to the handle wafer, and the bulk substrate layer (the sacrificial substrate) of the SOI wafer is removed. The process enables a backside connection system to be formed, in addition to a front-side connection system. Source and drain silicide is often specified to facilitate a good connection between the front-side or backside connection system with the devices. RF switch devices of mobile RF transceivers may be fabricated using CMOS transistors on SOI wafers.

Some switches (e.g., a shunt switch) in cellular handset applications are specified to sustain very high peak currents of over one ampere (1A) for several hundreds of nanoseconds. It is challenging for conventional switches (e.g., RF switches) or field effect transistors (FETs) to sustain and survive the electrostatic discharge (ESD) energy associated with this current specification for several reasons. This challenge is even more severe in switches with SOI technology than bulk technology switches because an oxide layer in the SOI switches isolates the handle wafer from the SOI and causes thermal issues and low ESD rating.

Another reason for reduced ESD rating is the non-uniform lateral NPN (negative-positive-negative) turn-on induced by impact ionization at a drain of an NPN transistor. This NPN turn-on results in current crowding and high localized energy dissipation, which causes failure associated with a secondary breakdown of the transistor. Thin SOI-based field effect transistors (e.g., N-type metal oxide semiconductor FETs), which is the dominant technology for RF switches due to low off mode capacitance (Coff) are particularly weak in this regard.

ESD protection is qualified using human-body model (HBM), machine model (MM), and charged-device model (CDM) testers. For an in-depth analysis however, transmission line pulse (TLP) testers are used to characterize the ESD relevant performance parameters of the protection clamps. The clamp failure current is called second breakdown point or secondary breakdown (It2).

Moreover, very large transistor width is desired because ESD rating does not scale linearly with transistor width. In addition, isolation performance degrades with increasing transistor width. Therefore, a very large transistor width is not an acceptable tradeoff to meet ESD rating.

Some implementations use an external transient voltage suppressor (TVS) to improve ESD rating. However, the use of an external transient voltage suppressor is not practical due to the non-linearity introduced by the transient voltage suppressor at high power.

Various aspects of the present disclosure provide techniques for improving the ESD rating of a multi-gate active device (e.g., a RF switch) using SOI technology. The process flow for semiconductor fabrication of the multi-gate active device may include front-end-of-line (FEOL) processes, middle-of-line (MOL) processes, and back-end-of-line (BEOL) processes. The MOL process is the set of process steps that enable connection of the transistors to the back-end-of-line or BEOL interconnects (e.g., M1, M2, etc.) using MOL contacts.

Aspects of the present disclosure are directed to a multi-gate active device that is robust enough to sustain increased ESD energy, and at the same time meet the isolation, insertion loss and linearity performance metrics. In one aspect, the multi-gate active device includes a source region coupled to source contacts and a first drain region coupled to first drain contacts. The source contacts are on a silicide region of the source region. The multi-gate active device further includes a first meshed silicide stop on the first drain region that surrounds the first drain contacts and a first gate over a first channel between the source region and the first drain region. The first drain contacts are on a silicide region of the first drain region. Thus, similar to the first drain contacts, the first meshed silicide stop surrounds the silicide region of the first drain region.

In one aspect of the disclosure, the meshed silicide stop overlaps a portion of the first gate. The overlap ensures that the region adjacent to the gate on the drain side is protected from silicidation for the worst case of CD (critical dimension) variation and photolithographic mis-registration.

The multi-gate active device has an asymmetric layout such that the gate-to-gate spacing at the source and the drain of multi-gate active device are different. For example, the multi-gate active device further includes a second drain region coupled to second drain contacts, a second meshed silicide stop on the second drain region that surrounds the second drain contacts, a second gate over a second channel between the source region and the second drain region, and a third gate adjacent to the first drain region. The source region and source contacts are between the first drain region and the second drain region. The third gate is over or on a third channel between the first drain region and another source region. The first drain region is between the first gate and the third gate and the source region is between the first gate and the second gate.

In one aspect, the asymmetric layout is manifested in the difference in spacing between the gates. For example, a first spacing between the first gate and the second gate is different than a second spacing between the first gate and the third gate. The benefits (e.g., improved ESD rating) of the asymmetric layout of the multi-gate active device is repeatable throughout multiple transistors unlike conventional CMOS ESD capability. Thus, increasing an overall width of the transistor improves the ESD rating, the HBM rating, or the second breakdown point of the multi-gate active device.

The multi-gate active device further includes a predefined silicide stop length between the first gate and a silicide region of the first drain region. This silicide stop length is defined based on a desired ESD rating.

FIG. 1 is a schematic diagram of a wireless device 100 (e.g., a cellular phone or a smartphone) including the multi-gate active device implemented according to aspects of the present disclosure. Thus, the wireless device 100 benefits from the advantages of the multi-gate active device. The wireless device 100 may include a wireless local area network (WLAN) (e.g., WiFi) module 150 and an RF front-end module 170 for a chipset 110. The WiFi module 150 includes a first diplexer 160 communicably coupling an antenna 162 to a wireless local area network module (e.g., WLAN module 152). The RF front-end module 170 includes a second diplexer 190 communicably coupling an antenna 192 to the wireless transceiver 120 (WTR) through a duplexer 180 (DUP).

The wireless transceiver 120 and the WLAN module 152 of the WiFi module 150 are coupled to a modem (MSM, e.g., a baseband modem) 130 that is powered by a power supply 102 through a power management integrated circuit (PMIC) 140. The chipset 110 also includes capacitors 112 and 114, as well as an inductor(s) 116 to provide signal integrity. The PMIC 140, the modem 130, the wireless transceiver 120, and the WLAN module 152 each include capacitors (e.g., 142, 132, 122, and 154) and operate according to a clock 118. The geometry and arrangement of the various inductor and capacitor components in the chipset 110 may reduce the electromagnetic coupling between the components.

The wireless transceiver 120 of the wireless device generally includes a mobile radio frequency (RF) transceiver to transmit and receive data for two-way communication. A mobile RF transceiver may include a transmit section for data transmission and a receive section for data reception. For data transmission, the transmit section may modulate an RF carrier signal with data to obtain a modulated RF signal, amplify the modulated RF signal using a power amplifier (PA) to obtain an amplified RF signal having the proper output power level, and transmit the amplified RF signal via the antenna 192 to a base station. For data reception, the receive section may obtain a received RF signal via the antenna 192 and may amplify the received RF signal using a low noise amplifier (LNA) and process the received RF signal to recover data sent by the base station in a communication signal.

The wireless transceiver 120 may include one or more circuits for amplifying these communication signals. The amplifier circuits (e.g., LNA/PA) may include one or more amplifier stages that may have one or more driver stages and one or more amplifier output stages. Each of the amplifier stages includes one or more transistors configured in various ways to amplify the communication signals. Various options exist for fabricating the transistors that are configured to amplify the communication signals transmitted and received by the wireless transceiver 120.

The wireless transceiver 120 and the RF front-end module 170 may be implemented using a layer transfer process to further separate the active device from a substrate as shown in FIGS. 2A to 2D.

Figure 2A:
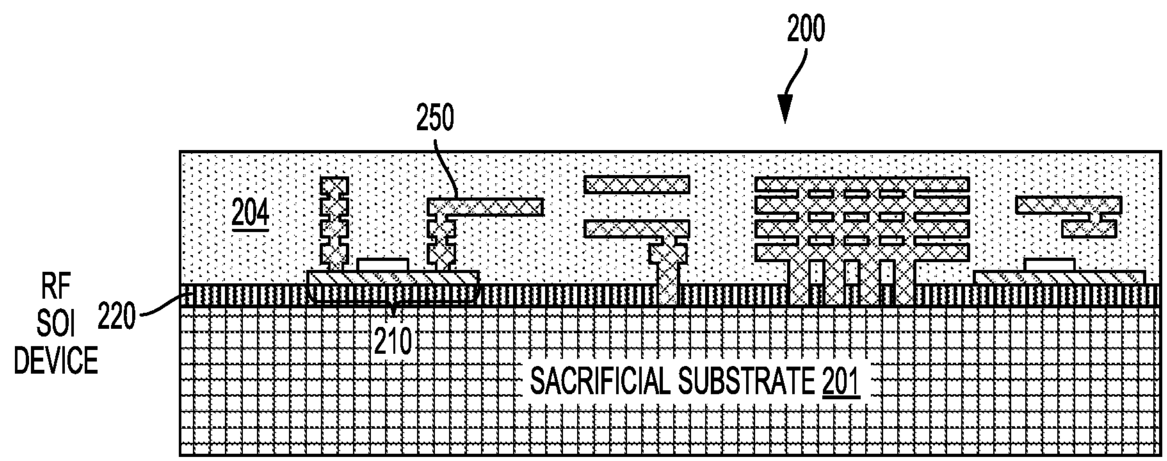
FIGS. 2A to 2D show cross-sectional views of a radio frequency integrated circuit (RFIC) during a layer transfer process.
Figure 2B:
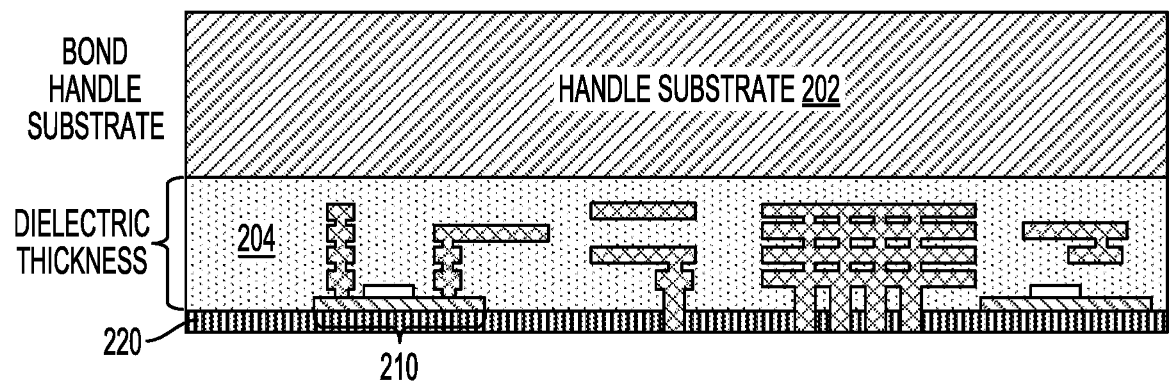

FIGS. 2A to 2D show cross-sectional views of a radio frequency (RF) integrated circuit 200 during a layer transfer process according to aspects of the present disclosure. As shown in FIG. 2A, an RF device includes an active device 210 on an insulator layer 220 supported by a sacrificial substrate 201 (e.g., a bulk wafer). The RF device also includes interconnects 250 coupled to the active device 210 within a first dielectric layer 204. As shown in FIG. 2B, a handle substrate 202 is bonded to the first dielectric layer 204 of the RF device. In addition, the sacrificial substrate 201 is removed. Removal of the sacrificial substrate 201 using the layer transfer process enables high-performance, low-parasitic RF devices by increasing the dielectric thickness. That is, a parasitic capacitance of the RF device is proportional to the dielectric thickness, which determines the distance between the active device 210 and the handle substrate 202.

Figure 2C:
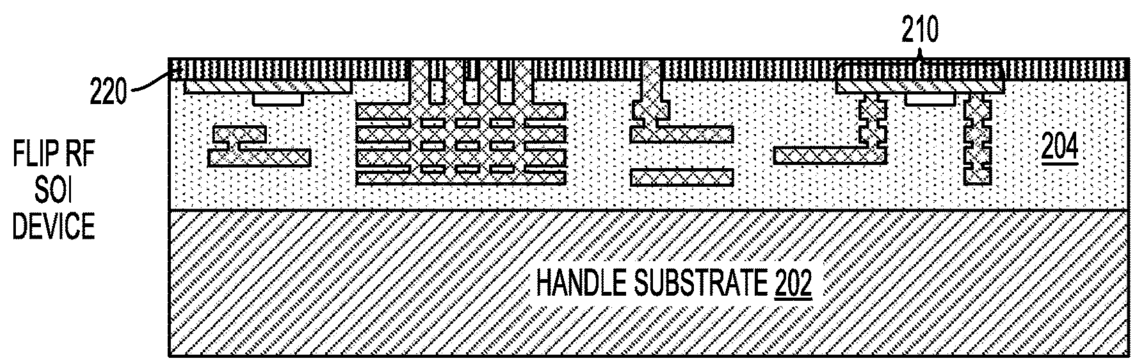
Figure 2D:
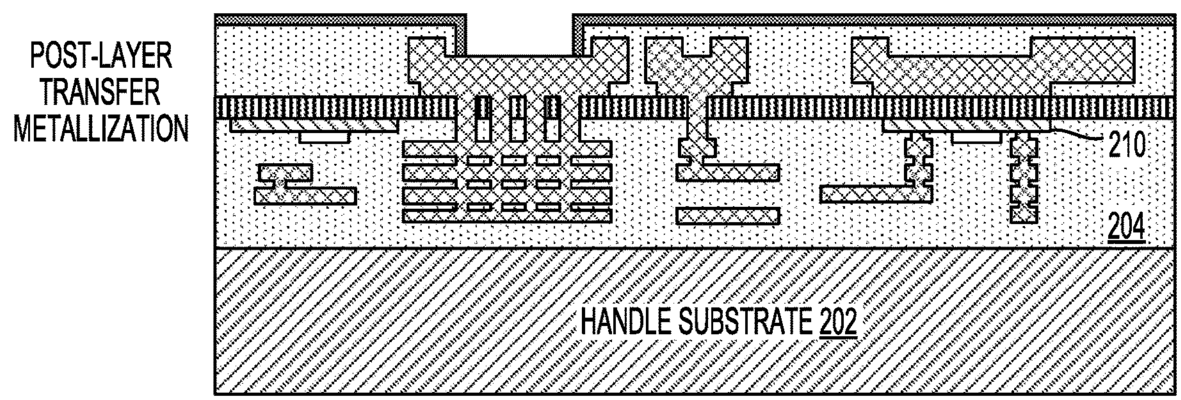

As shown in FIG. 2C, the RF device is flipped once the handle substrate 202 is secured and the sacrificial substrate 201 is removed. As shown in FIG. 2D, a post layer transfer metallization process is performed using, for example, a regular complementary metal oxide semiconductor (CMOS) process.

The active device 210 on the insulator layer 220 (e.g., BOX layer) may be a complementary metal oxide semiconductor (CMOS) transistor. The RF front-end module 170 (FIG. 1) may rely on these high performance CMOS RF switch technologies for successful operation.

Figure 3A:
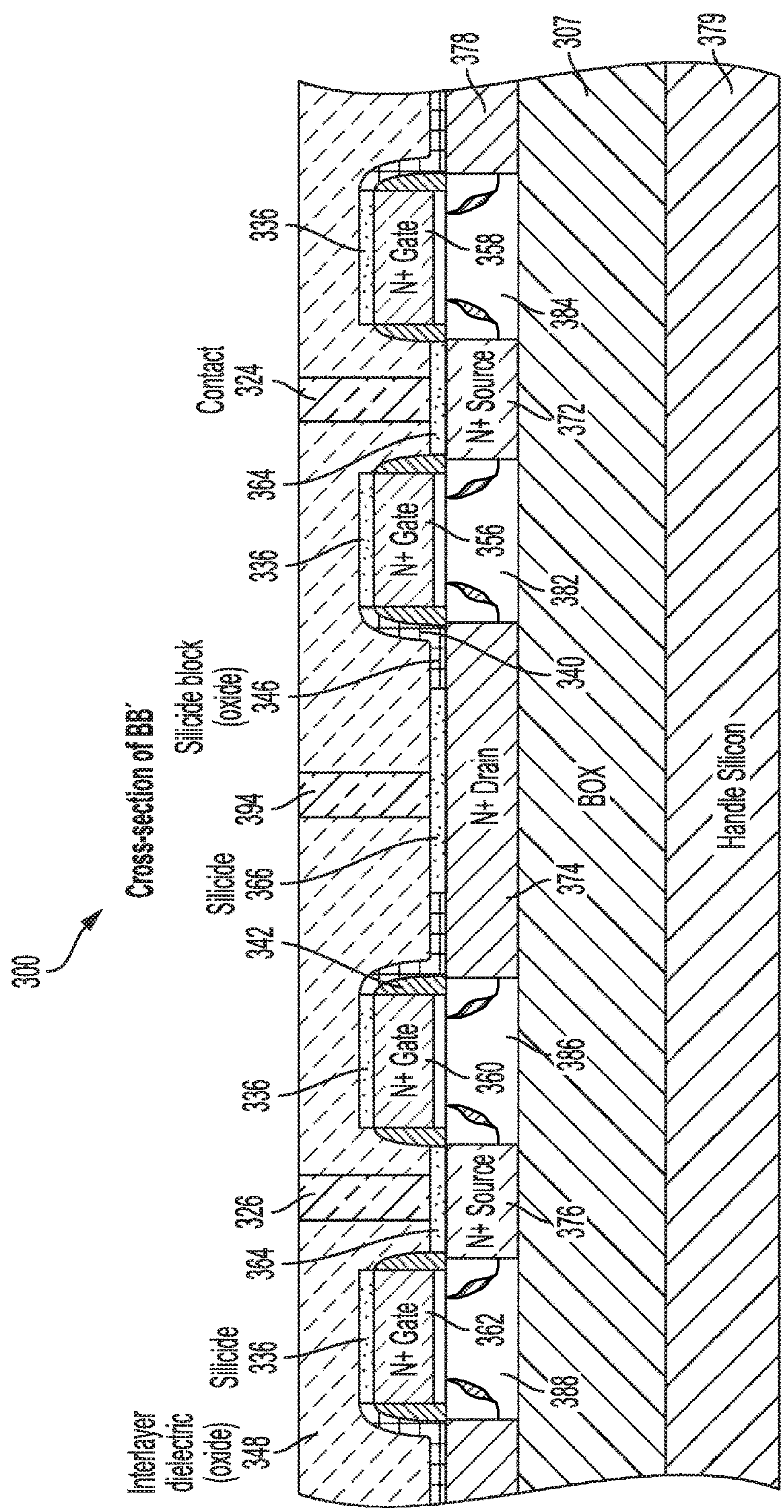
FIG. 3A illustrates a cross-section of a multi-gate active device with improved electrostatic discharge rating, according to aspects of the present disclosure.

FIG. 3A illustrates a cross-section of a multi-gate active device 300 with improved electrostatic discharge rating, according to aspects of the present disclosure. The multi-gate active device 300 includes multiple active devices, with each active device having a gate, drain regions, and source regions.

In one aspect, the multi-gate active device 300 includes a first gate 356, a second gate 358, a third gate 360, and a fourth gate 362. The multi-gate active device 300 further includes a first drain region 374, a second drain region 378, a first source region 372, and a second source region 376. The multi-gate active device 300 also includes a first channel 382, a second channel 384, a third channel 386, and a fourth channel 388. The first drain region 374, the second drain region 378, the first source region 372, the second source region 376, the first channel 382, the second channel 384, the third channel 386, and the fourth channel 388 are formed on an isolation layer 307. The isolation layer 307 is on a handle silicon substrate 379.

One aspect of the present disclosure uses a silicidation process to form silicide regions on which contacts are formed. For example, the multi-gate active device 300 includes a silicide region 336 on each of the first gate 356, the second gate 358, the third gate 360, and the fourth gate 362. The multi-gate active device 300 includes a silicide region 364 on each of the first source region 372 and the second source region 376. A first conductive contact 324 is formed on the silicide region 364 of the first source region 372 and a second conductive contact 326 is formed on the silicide region 364 of the second source region 376. The first gate 356, the second gate 358, the third gate 360, and the fourth gate 362 are formed in or partially surrounded by an interlayer dielectric 348 (e.g., an oxide).

The multi-gate active device 300 further includes a first meshed silicide stop/block 346 on the first drain region 374 that surrounds the first drain contacts (e.g., a drain contact 394). This feature is better illustrated in FIG. 3B. The first gate 356 is over the first channel 382 between the first source region 372 and the first drain region 374. The first drain contacts (e.g., drain contact 394) are on the silicide region 366 of the first drain region 374. Thus, similar to the first drain contacts, the first meshed silicide stop 346 surrounds the silicide region 366 of the first drain region 374. In one aspect of the disclosure, the first meshed silicide stop 346 overlaps a portion of the first gate 356 and the third gate 360. For example, a first portion 340 of the first meshed silicide stop 346 is on a sidewall of the first gate 356 and a second portion 342 of the first meshed silicide stop 346 is on a sidewall of the third gate 360. The overlap accounts for or mitigates misalignment tolerance in the multi-gate active device 300. The features of the first drain region 374 are repeated on other drain regions (e.g., the second drain region 378).

Figure 3B:
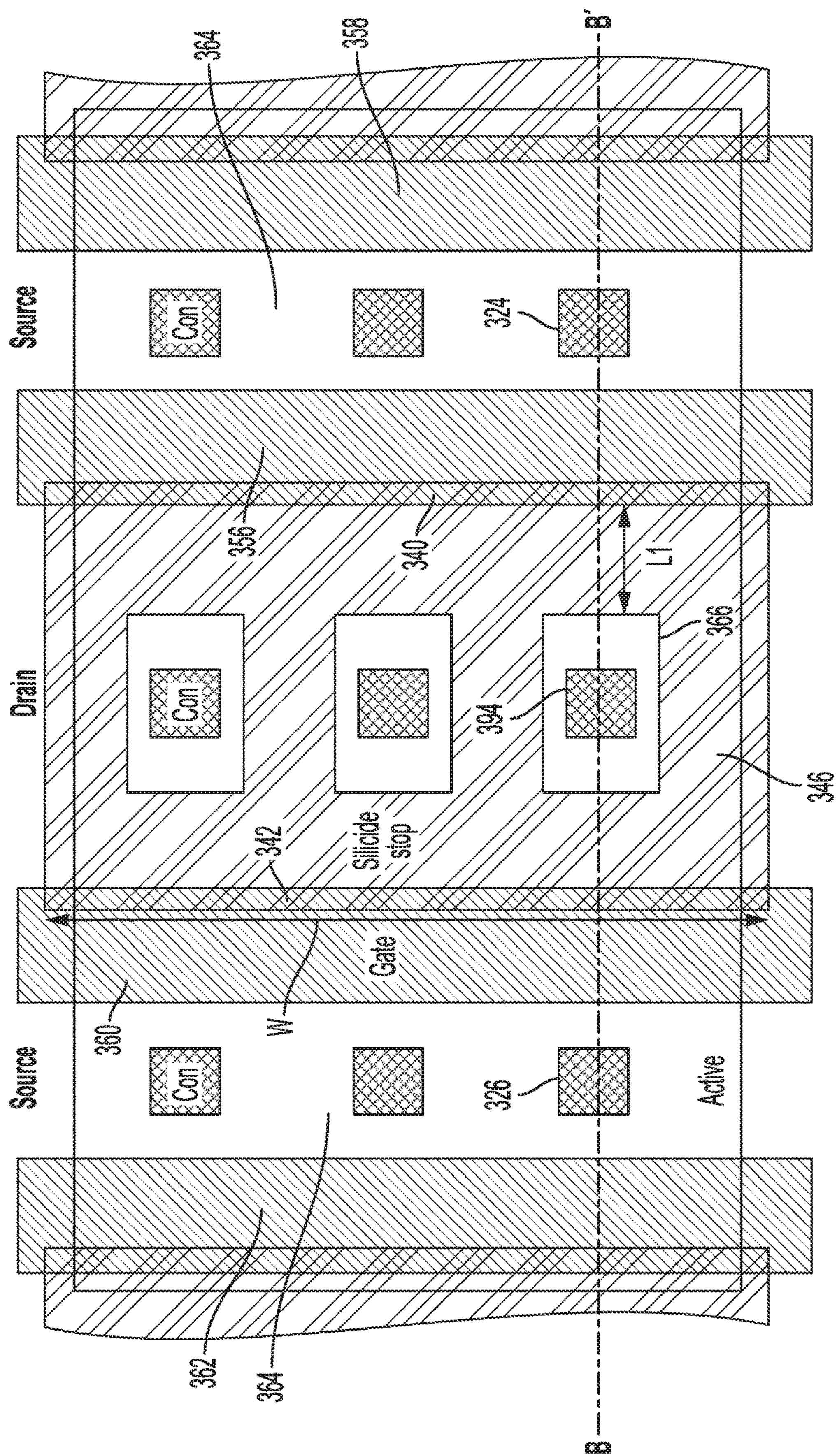
FIG. 3B illustrates a top view of the multi-gate active device of FIG. 3A, according to aspects of the present disclosure.

FIG. 3B illustrates a top view of the multi-gate active device 300 of FIG. 3A, according to aspects of the present disclosure. For illustrative purposes, some of the labelling and numbering of the devices and features of FIG. 3B are similar to those of the FIG. 3A, however, not all features of FIG. 3A that are discussed with reference to FIG. 3B are visible in the top view of FIG. 3B. The cross-section of FIG. 3A is taken across the axis BB', as shown in FIG. 3B.

The multi-gate active device 300 includes the first meshed silicide stop 346 on the first drain region 374 that surrounds the first drain contacts. For example, the first meshed silicide stop 346 is formed by masking portions of the first drain region 374 such that silicide formation only occurs on un-masked portions of the first drain region 374. Thus, the silicide region 366 is formed on the un-masked portions and the drain contact 394 is formed on the silicide region 366. The first drain region 374 may include multiple silicide regions 366 and multiple drain contacts 394 formed on their respective silicide regions 366.

The multiple silicide regions 366 and the multiple drain contacts 394 are surrounded by the first meshed silicide stop 346 to form a distributive ballast. The distributive ballast is a distributed ballasting resistance inserted into the drain region of the multi-gate active device 300, promoting a much more uniform turn-on of the parasitic lateral NPN, thereby preventing current crowding and high localized energy dissipation. The ballasting resistance is realized by introducing the silicide blocking on the meshed silicide stop. The formation of the meshed silicide stop (e.g., the first meshed silicide stop 346) does not introduce an added mask or processing steps because a silicide stop mask creates the precision resistors. For example, conventional implementations use the silicide stop mask to form silicide stops for resistors. Silicide is removed from resistor areas because the silicide reduces resistance. The same silicide stop process can be used to define a silicide stop for the drain region of the multi-gate active device 300.

The multi-gate active device 300 has an asymmetric layout such that the gate-to-gate spacings at the source and drain of multi-gate active device 300 are different. The first source region 372 and its corresponding first conductive contact 324 (or first source contact) are between the first drain region 374 and the second drain region 378. The second gate 358 is over the second channel 384 between the second drain region 378 and the first source region 372. The third gate 360 is over the third channel 386 between the first drain region 374 and the second source region 376. The first drain region 374 is between the first gate 356 and the third gate 360. The first source region 372 is between the first gate 356 and the second gate 358, while the second source region 376 is between the third gate 360 and the fourth gate 362.

In one aspect, the asymmetric layout is manifested in the difference in spacing between the gates associated with the source and the drain of the multi-gate active device 300. For example, a first spacing between the first gate 356 and the second gate 358, between which the first source region 372 is included, is different than a second spacing between the first gate 356 and the third gate 360, between which the first drain region 374 is included. In contrast, the first spacing is the same as a third spacing between the third gate 360 and the fourth gate 362, between which the second source region 376 is included. Thus, the gate spacing associated with the source regions are asymmetric relative to the gate spacing associated with the drain regions.

The multi-gate active device 300 further includes a predefined silicide stop length L1 between the first gate 356 and a silicide region (e.g., silicide region 366) of the first drain region 374. This silicide stop length L1 is defined based on a desired ESD rating (e.g., customer specification). Increasing the silicide length improves ESD protection but increases an on state resistance Ron.

The benefits (e.g., improved ESD rating) of the asymmetric layout of the multi-gate active device 300 are repeatable throughout multiple transistors and gate-to-gate spacing, unlike conventional CMOS ESD capability. Increasing an overall width of the transistor improves the ESD rating, the HBM rating or the second breakdown point of the multi-gate active device. FIG. 3B illustrates a unit finger width W. A net width may be given by a product of the unit finger width W and a number of fingers of multi-finger transistors connected in parallel. Aspects of the present disclosure are scalable. For example, with respect to the disclosed transistors, the ESD strength (e.g., HBM rating), increases proportionally with net width. In one aspect, the HBM rating increases by a factor of two when the net width increases by a factor of two. The scalability is a benefit of the distributed drain ballast, while practically eliminating current crowding resulting in high localized energy dissipation in a standard CMOS.

Figure 3C:
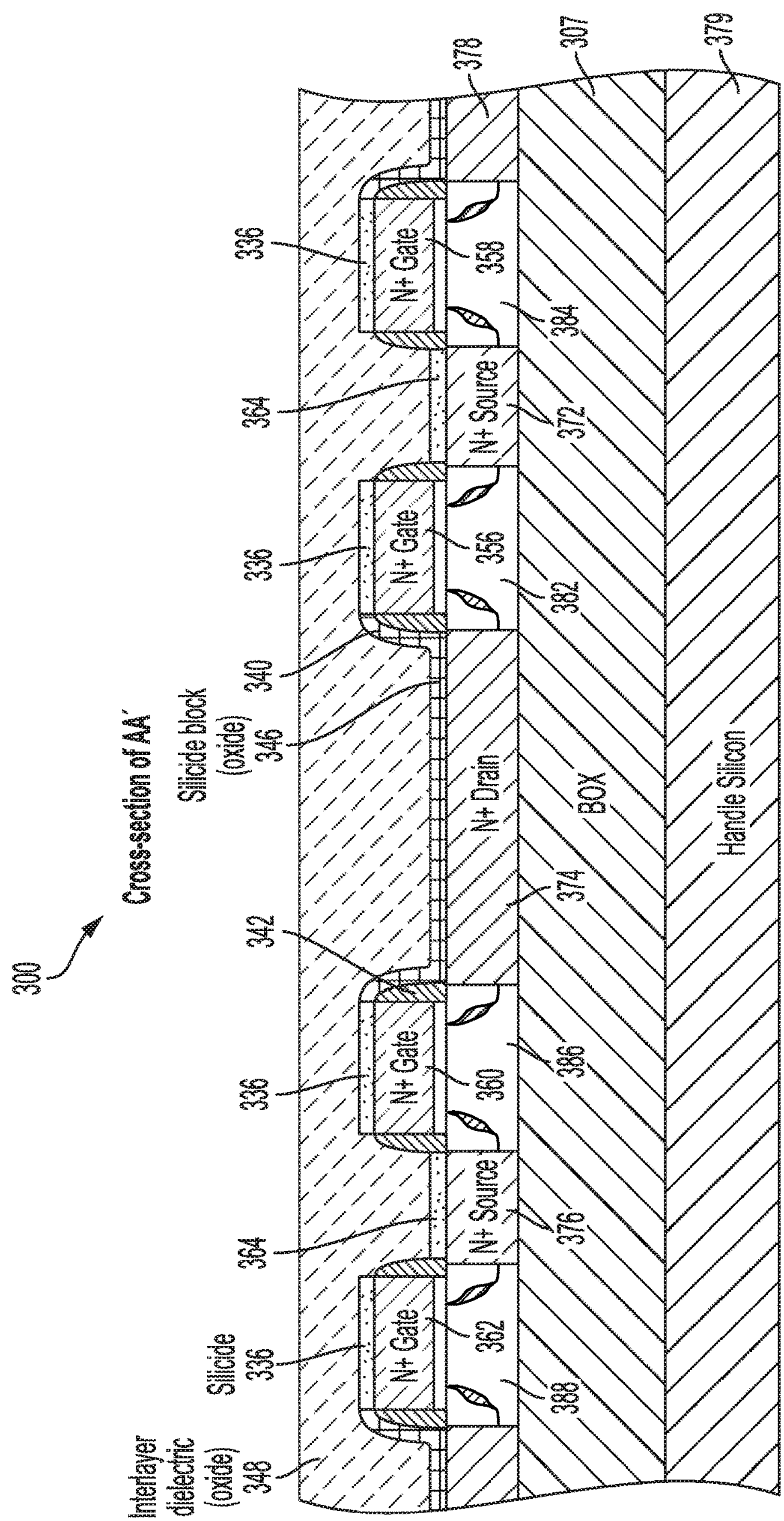
FIG. 3C illustrates another cross-section of a multi-gate active device with improved electrostatic discharge rating, according to aspects of the present disclosure.

FIG. 3C illustrates another cross-section of the multi-gate active device 300, according to aspects of the present disclosure. The labelling and numbering of the devices and features of FIG. 3C are similar to those of the FIG. 3A and FIG. 3B. However, because of the axis (see axis AA' of FIG. 3D) along which the cross-section of FIG. 3C is taken, FIG. 3C does not include some of the features included in FIG. 3A. For example, the first meshed silicide stop 346 is patterned to accommodate the silicide regions of the first drain region 374. Thus, the first meshed silicide stop 346 in the cross-section of FIG. 3C extends across an entire surface of the first drain region 374 as opposed to portions of the first drain region 374 as shown in FIG. 3A. Moreover, the axis of the cross-section of FIG. 3C does not coincide with the first conductive contact 324, the second conductive contact 326, or the drain contact 394, which are therefore excluded in FIG. 3C.

Figure 3D:
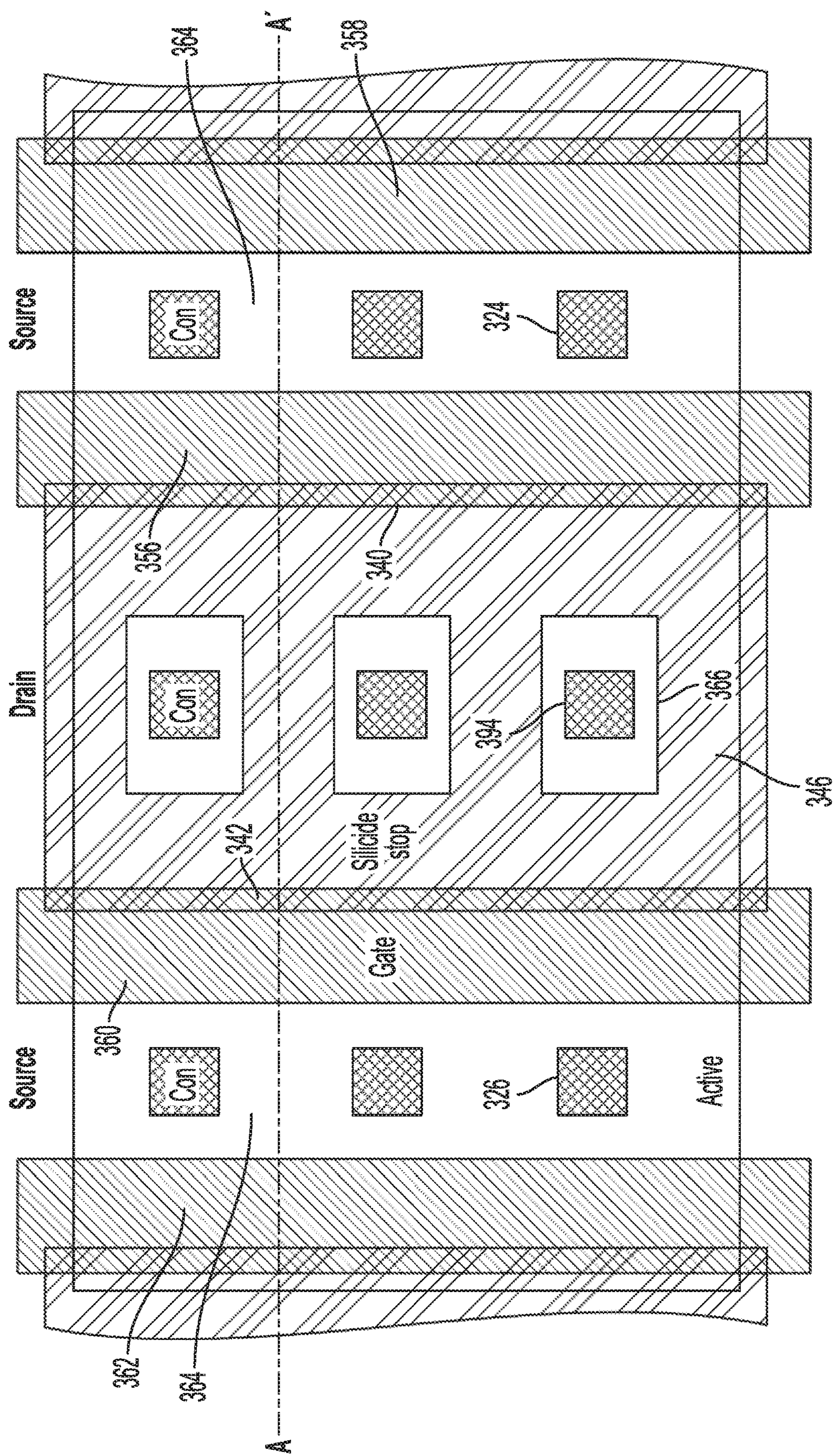
FIG. 3D illustrates a top view of the multi-gate active device of FIG. 3C, according to aspects of the present disclosure.

FIG. 3D illustrates a top view of the multi-gate active device 300 of FIG. 3C, according to aspects of the present disclosure. Accordingly, the labelling and numbering of the devices and features of FIG. 3D are similar to those of the FIGS. 3A, 3B, and 3C. For example, the cross-section of FIG. 3C is taken across the axis AA', as shown in FIG. 3D.

Figure 4A:
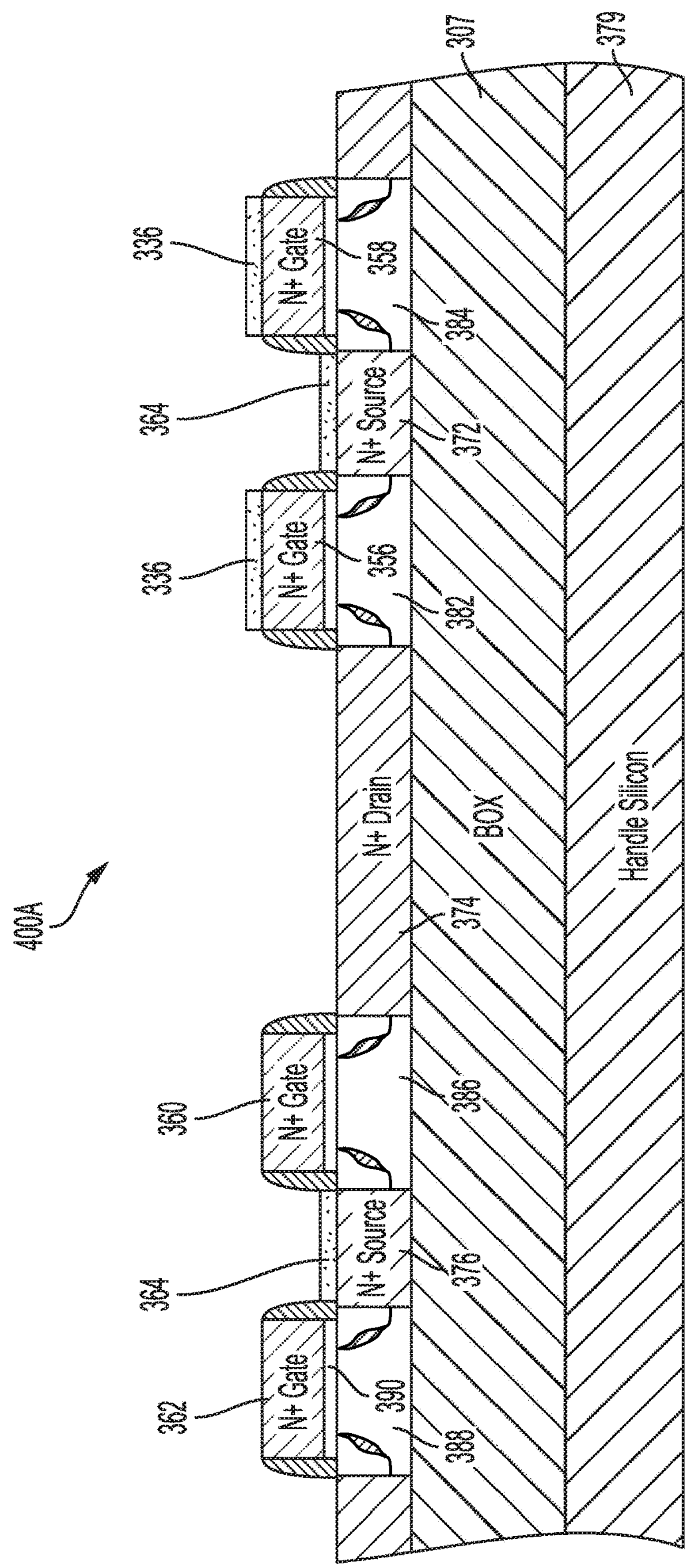
FIGS. 4A, 4B, and 4C are exemplary diagrams illustrating stages of a method of fabricating a multi-gate active device with improved electrostatic discharge rating, according to an aspect of the present disclosure.
Figure 4B:
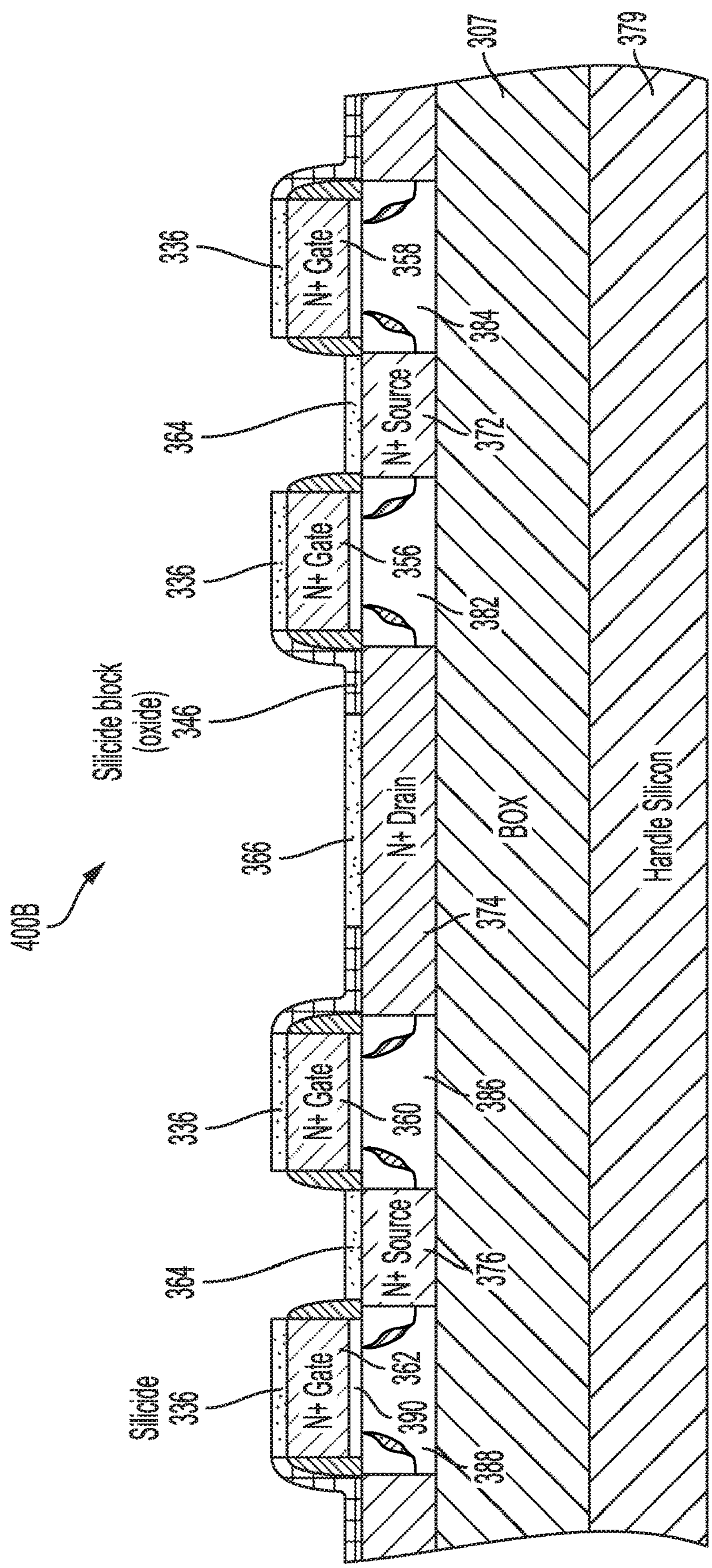
Figure 4C:
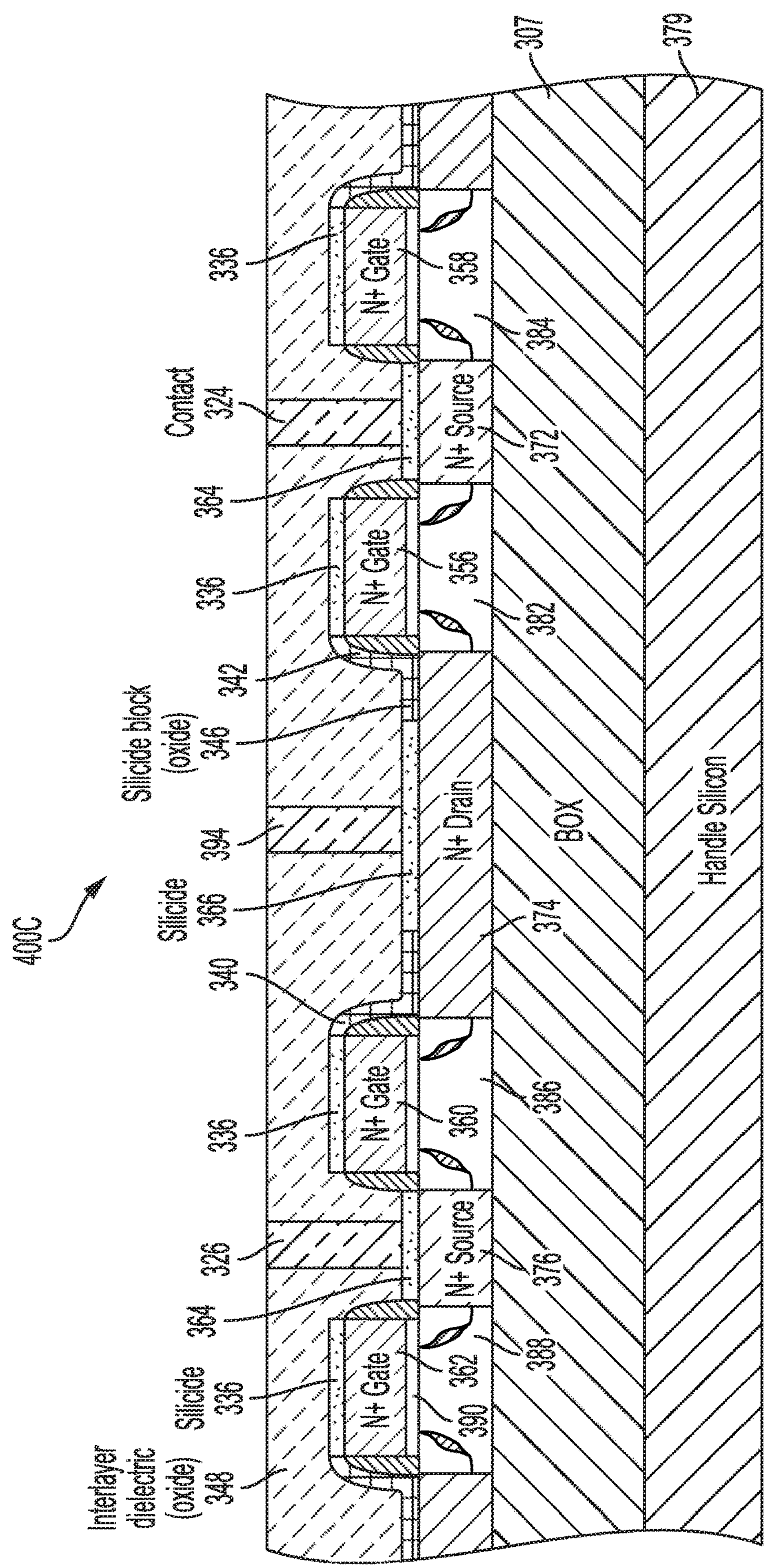

FIGS. 4A, 4B, and 4C are exemplary diagrams illustrating stages of a method of fabricating the multi-gate active device 300 with improved electrostatic discharge rating, according to an aspect of the present disclosure. For illustrative purposes, some of the labelling and numbering of the devices and features of FIGS. 4A, 4B, and 4C are similar to those of FIGS. 3A, 3B, 3C, and 3D.

Referring to FIG. 4A, a first stage 400A of the method of fabricating the multi-gate active device 300 is depicted. FIG. 4A illustrates the first stage 400A of fabricating the multi-gate active device 300 after depositing a gate insulator material (e.g., gate oxide), polysilicon, or poly deposit in accordance with gate formation. The gate formation includes patterning the polysilicon gate and etching. The polysilicon gate formation is followed by forming lightly doped drain (LDD) (e.g., N-type LDD) regions or masked halo implants. The first stage 400A further include spacer formation, implanting of an N-type (e.g., N+) source/drain (SD) and source/drain rapid thermal annealing.

Referring to FIG. 4B, a second stage 400B of the method of fabricating the multi-gate active device 300 is depicted. FIG. 4B illustrates forming the meshed silicide stop 346. One way to form the meshed silicide stop 346 is through patterning. The patterning is uniform to create a distributive ballast that can be scaled with respect to the overall width of the multi-gate active device 300 and with respect to the silicide stop link scalability of the ESD rating. The clamp failure current It2 or HBM rating increases linearly with drain ballast length L1, illustrated in FIG. 3B. For example, the clamp failure current It2 increases by 0.45 A/mm (amperes per millimeter) for every 100 mm increase in drain ballast length L1. The drain ballast length L1 and the overall device width are design variables to achieve the desired HBM rating, while improving the RF switch isolation and insertion loss.

A silicide stop dielectric (e.g., an oxide, oxide nitride or other dielectric) is deposited on the first drain region 374 and on portions (e.g., a sidewall) of the gates. This dielectric is then patterned using a silicide stop mask to form regions protected from silicidation, and other regions where the silicide is deposited. Thus, after this step, islands of oxide remain in the regions intended for "no silicide."

For example, forming the silicide region 366 includes implanting a silicon layer with pre-amorphizing implants (e.g., germanium) and depositing silicide material (e.g., titanium (Ti)+cobalt (Co)+Ti nitride, titanium nitride, tungsten, or nickel) on the pre-amorphizing implants followed by silicide anneal to form the silicide region 366. The unreacted metals are then stripped or etched.

Referring to FIG. 4C, a third stage 400C of the method of fabricating the multi-gate active device 300 is depicted. FIG. 4C illustrates depositing of the interlayer dielectric (e.g., oxide) 348 and planarization with chemical mechanical polishing (CMP). In one aspect, a contact mask is deposited on the first drain region 374 and a contact hole is etched. After the contact hole is opened, a tungsten metal layer is deposited to form a contact (e.g., the drain contact 394). The tungsten metal layer is planarized using CMP. The aspects of the present disclosure (e.g., process of forming the meshed silicide stop) may be implemented with an FEOL process.

Figure 5:
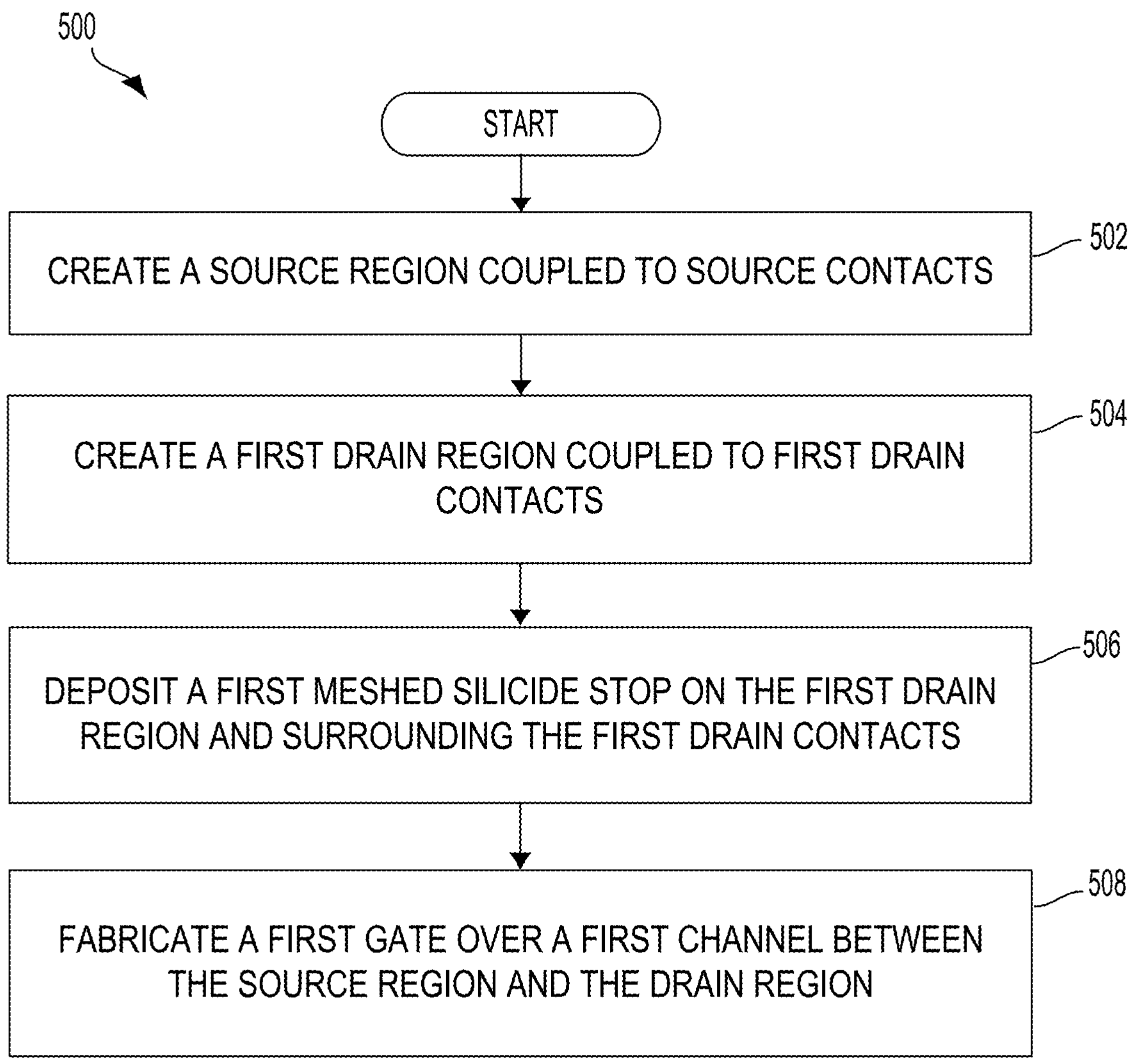
FIG. 5 is a process flow diagram illustrating a method of constructing a multi-gate active device with improved electrostatic discharge rating, according to aspects of the present disclosure.

FIG. 5 is a process flow diagram illustrating a method 500 of fabricating a multi-gate active device, according to an aspect of the present disclosure. The blocks in the method 500 may be performed in or out of the order shown, and in some aspects, can be performed at least in part in parallel.

At block 502, a source region coupled to source contacts is created. At block 504, a first drain region coupled to first drain contacts is created. At block 506, a first meshed silicide stop is deposited on the first drain region and surrounding the first drain contacts. At block 508, a first gate is fabricated over a first channel between the source region and the first drain region.

According to a further aspect of the present disclosure, a multi-gate active device is described. The multi-gate active device includes means for protecting the first drain regions from silicidation. The protecting means may be the first meshed silicide stop 346, the first portion 340 of the first meshed silicide stop 346 and/or the second portion 342 of the first meshed silicide stop 346, as shown in FIGS. 3A, and 3B. In another aspect, the aforementioned means may be any module or any apparatus configured to perform the functions recited by the aforementioned means.

Figure 6:
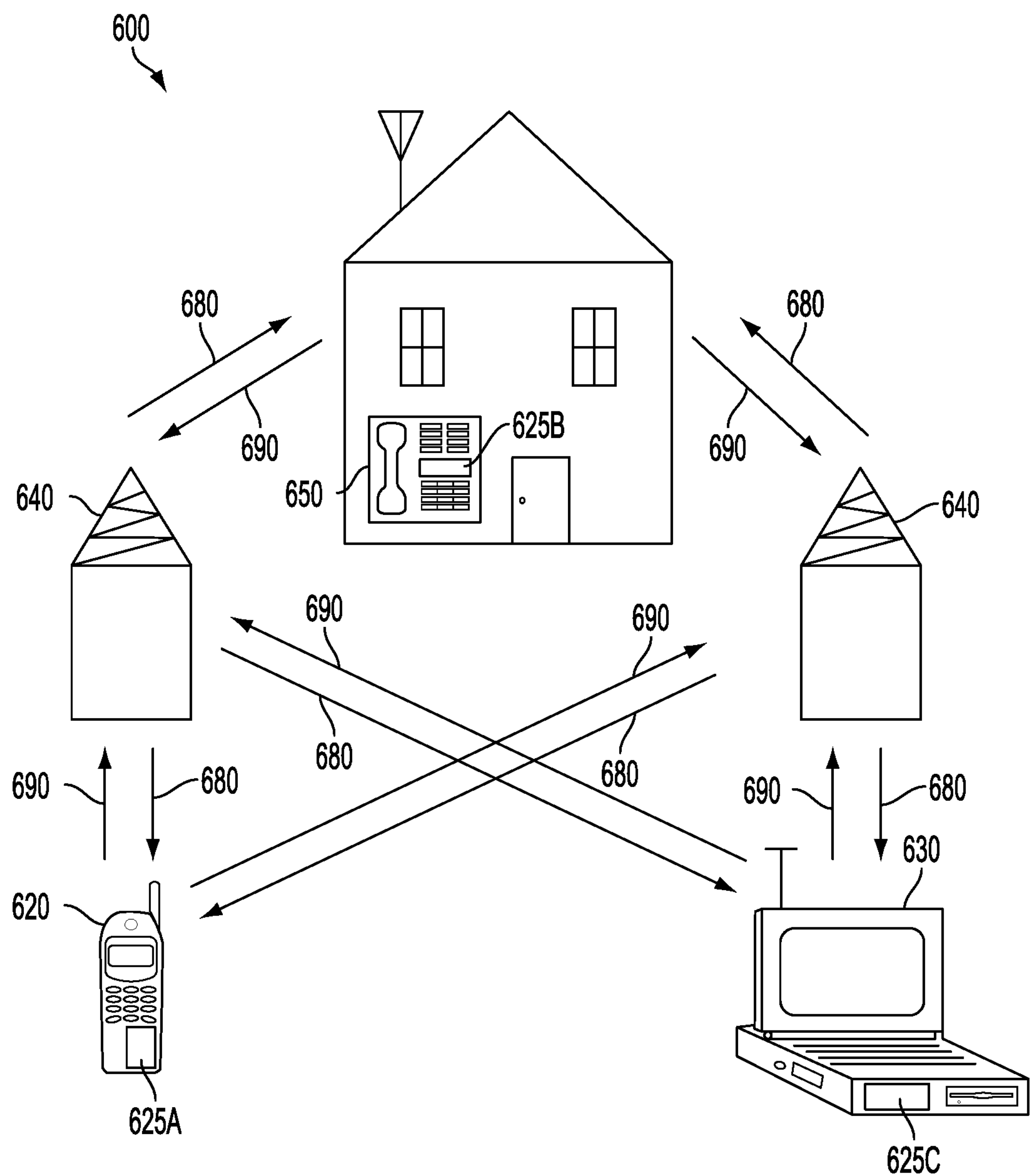
FIG. 6 is a block diagram showing an exemplary wireless communication system in which a configuration of the present disclosure may be advantageously employed.

FIG. 6 is a block diagram showing an exemplary wireless communication system 600 in which an aspect of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include IC devices 625A, 625C, and 625B that include the disclosed multi-gate active device. It will be recognized that other devices may also include the disclosed multi-gate active device, such as the base stations, switching devices, and network equipment. FIG. 6 shows forward link signals 680 from the base station 640 to the remote units 620, 630, and 650 and reverse link signals 690 from the remote units 620, 630, and 650 to base stations 640.

In FIG. 6, remote unit 620 is shown as a mobile telephone, remote unit 630 is shown as a portable computer, and remote unit 650 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 6 illustrates remote units according to the aspects of the disclosure, the disclosure is not limited to these exemplary illustrated units. Aspects of the disclosure may be suitably employed in many devices, which include the disclosed multi-gate active device.

Figure 7:
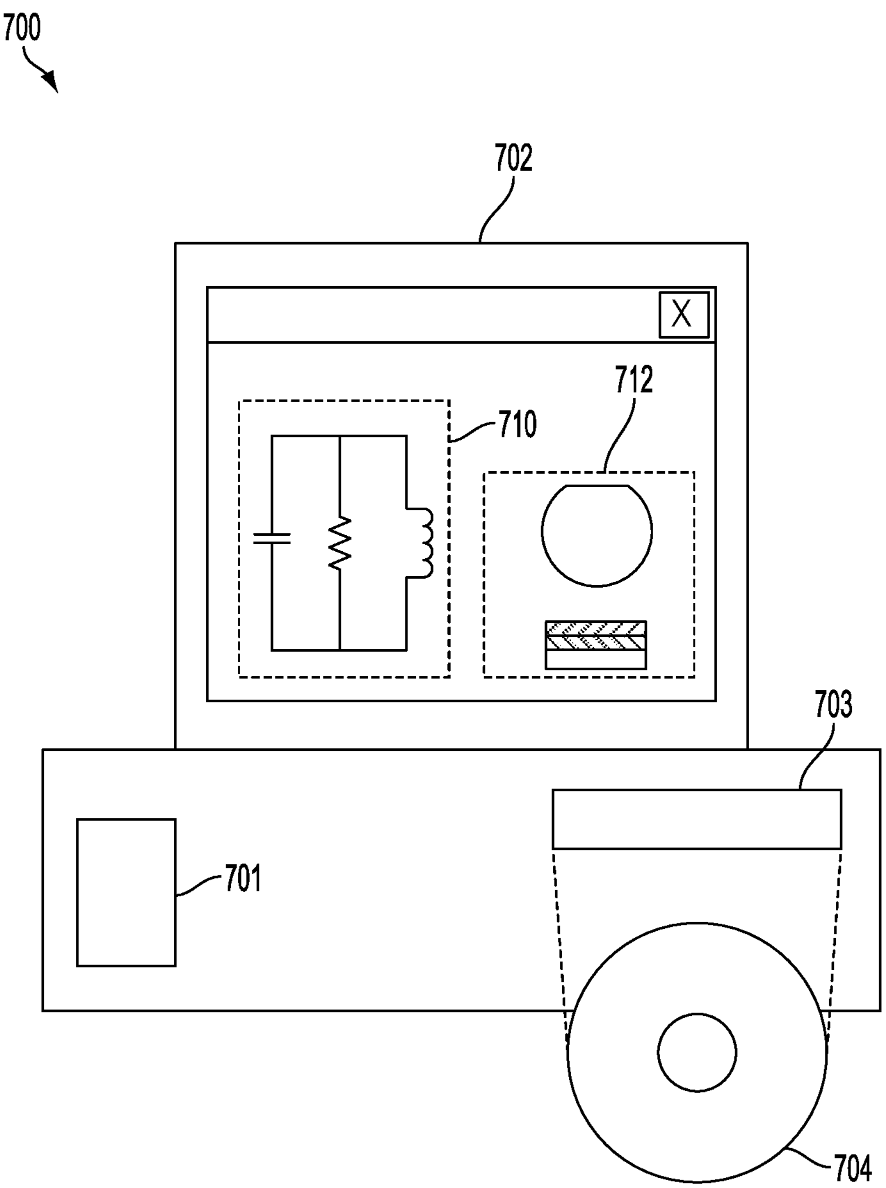
FIG. 7 is a block diagram illustrating a design workstation used for circuit, layout, and logic design of a semiconductor component according to one configuration of the present disclosure.

FIG. 7 is a block diagram illustrating a design workstation used for circuit, layout, and logic design of a semiconductor component, such as the multi-gate active device disclosed above. A design workstation 700 includes a hard disk 701 containing operating system software, support files, and design software such as Cadence or OrCAD. The design workstation 700 also includes a display 702 to facilitate a circuit design 710 or a multi-gate active device design 712. A storage medium 704 is provided for tangibly storing the circuit design 710 or the multi-gate active device design 712. The circuit design 710 or the multi-gate active device design 712 may be stored on the storage medium 704 in a file format such as GDSII or GERBER. The storage medium 704 may be a CD-ROM, DVD, hard disk, flash memory, or other appropriate device. Furthermore, the design workstation 700 includes a drive apparatus 703 for accepting input from or writing output to the storage medium 704.

Data recorded on the storage medium 704 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 704 facilitates the circuit design 710 or the multi-gate active device design 712 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A multi-gate active device comprising:

a source region coupled to source contacts;

a first drain region coupled to first drain contacts;

a first meshed silicide stop on the first drain region and surrounding the first drain contacts;

a first gate on a first channel between the source region and the first drain region;

a second drain region coupled to second drain contacts;

a second meshed silicide stop on the second drain region and surrounding the second drain contacts;

a second gate on a second channel between the source region and the second drain region; and a third gate adjacent to the first drain region, the third gate on a third channel between the first drain region and another source region, the first drain region between the first gate and the third gate, the source region between the first gate and the second gate, a first spacing between the first gate and the second gate being different than a second spacing between the first gate and the third gate.

2. A method of making a multi-gate active device comprising:

creating a source region coupled to source contacts;

creating a first drain region coupled to first drain contacts through a drain silicide region on the first drain region;

depositing a first meshed silicide stop on the first drain region and surrounding the first drain contacts;

fabricating a first gate on a first channel between the source region and the first drain region;

depositing a gate silicide region on the first gate, in which the first meshed silicide stop comprises a predefined silicide stop length between the gate silicide region and the drain silicide region;

creating a second drain region coupled to second drain contacts;

depositing a second meshed silicide stop on the second drain region and surrounding the second drain contacts;

fabricating a second gate on a second channel between the source region and the second drain region; and fabricating a third gate adjacent to the first drain region, the third gate on a third channel between the first drain region and another source region, the first drain region between the first gate and the third gate, the source region between the first gate and the second gate, a first spacing between the first gate and the second gate being different than a second spacing between the first gate and the third gate.

3. The method of claim 2, further comprising fabricating the source contacts on a silicide region of the source region.

4. The method of claim 2, in which making the multi-gate active device comprises making a shunt switch.

5. A multi-gate active device comprising:

a source region coupled to source contacts;

a first drain region coupled to first drain contacts;

means for protecting the first drain region from silicidation, the protecting means surrounding the first drain contacts;

a first gate on a first channel between the source region and the first drain region;

a second drain region coupled to second drain contacts;

a meshed silicide stop on the second drain region and surrounding the second drain contacts;

a second gate on a second channel between the source region and the second drain region; and a third gate adjacent to the first drain region, the third gate on a third channel between the first drain region and another source region, the first drain region between the first gate and the third gate, the source region between the first gate and the second gate, a first spacing between the first gate and the second gate being different than a second spacing between the first gate and the third gate.

6. The multi-gate active device of claim 5, in which the protecting means overlaps a portion of the first gate.

7. The multi-gate active device of claim 5, in which spacing between gates of the multi-gate active device is asymmetric.

8. The multi-gate active device of claim 5, further comprising a predefined length of the protecting means between the first gate and a silicide region of the first drain region.

9. The multi-gate active device of claim 8, in which the first drain contacts are on the silicide region of the first drain region.

10. The multi-gate active device of claim 5, in which the source contacts are on a silicide region of the source region.

11. The multi-gate active device of claim 5 comprising a shunt switch.

* * * * *